(12) United States Patent
Liao et al.

(10) Patent No.: US 12,374,629 B2
(45) Date of Patent: Jul. 29, 2025

(54) ELECTROMAGNETIC INTERFERENCE SHIELDING PACKAGE STRUCTURE, MANUFACTURING METHOD THEREOF, AND ELECTRONIC ASSEMBLY

(71) Applicant: AZUREWAVE TECHNOLOGIES, INC., New Taipei (TW)

(72) Inventors: Chih-Hao Liao, Taipei (TW); Shu-Han Wu, Taipei (TW); Hsin-Yeh Huang, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 456 days.

(21) Appl. No.: 17/988,844

(22) Filed: Nov. 17, 2022

(65) Prior Publication Data

US 2024/0113036 A1   Apr. 4, 2024

(30) Foreign Application Priority Data

Sep. 29, 2022   (TW) .................................. 111136877

(51) Int. Cl.
*H01L 23/552* (2006.01)
*H01L 21/56* (2006.01)
*H01L 23/31* (2006.01)

(52) U.S. Cl.
CPC .......... *H01L 23/552* (2013.01); *H01L 21/563* (2013.01); *H01L 23/3121* (2013.01)

(58) Field of Classification Search
CPC ..... H01L 23/60; H01L 23/552; H01L 21/563; H01L 23/3121; H01L 21/568; H01L 2924/19105

USPC ........................................................ 257/659
See application file for complete search history.

(56) References Cited

U.S. PATENT DOCUMENTS

| 9,974,215 | B1* | 5/2018 | Jeong | H01L 23/3135 |
| 10,438,901 | B1* | 10/2019 | Krefft | H01L 23/08 |
| 2005/0045358 | A1* | 3/2005 | Arnold | H01L 23/295 |
| | | | | 174/51 |
| 2008/0210462 | A1* | 9/2008 | Kawagishi | H01L 24/97 |
| | | | | 29/841 |

(Continued)

FOREIGN PATENT DOCUMENTS

| TW | 201407745 A | 2/2014 |
| TW | 202008556 A | 2/2020 |
| TW | M636572 U | 1/2023 |

*Primary Examiner* — Didarul A Mazumder
(74) *Attorney, Agent, or Firm* — Li & Cai Intellectual Property (USA) Office

(57) ABSTRACT

An electromagnetic interference (EMI) shielding package structure, a manufacturing method thereof, and an electronic assembly are provided. The EMI shielding package structure includes a carrier, at least one chip mounted on a first board surface of the carrier, an encapsulant formed on the carrier and packaging the at least one chip, an EMI shielding layer formed on an outer surface of the encapsulant, and an insulating layer. The insulating layer includes a spraying portion and a capillary permeating portion. The spraying portion is formed at least part of an outer surface of the EMI shielding layer. The capillary permeating portion is formed by extending from a bottom end of the spraying portion toward a second board surface of the carrier through capillarity, and the capillary permeating portion covers a bottom edge of the EMI shielding layer.

4 Claims, 10 Drawing Sheets

(56) References Cited

U.S. PATENT DOCUMENTS

| | | |
|---|---|---|
| 2014/0035097 A1 | 2/2014 | Lin et al. |
| 2015/0061095 A1* | 3/2015 | Choi ................... H01L 23/5385 |
| | | 257/777 |
| 2017/0015548 A1* | 1/2017 | Mao .................... B81C 1/00333 |
| 2017/0301628 A1* | 10/2017 | Kawabata ......... H01L 21/32051 |
| 2017/0345793 A1* | 11/2017 | Miyairi ................. H01L 24/02 |
| 2018/0158782 A1* | 6/2018 | Kawabata ............... H01L 24/97 |
| 2021/0225779 A1* | 7/2021 | Otsubo ............... H01L 23/3121 |
| 2021/0327825 A1 | 10/2021 | Lu et al. |

\* cited by examiner

ELECTROMAGNETIC INTERFERENCE SHIELDING PACKAGE STRUCTURE, MANUFACTURING METHOD THEREOF, AND ELECTRONIC ASSEMBLY

CROSS-REFERENCE TO RELATED PATENT APPLICATION

This application claims the benefit of priority to Taiwan Patent Application No. 111136877, filed on Sep. 29, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to an electromagnetic interference (EMI) shielding package structure, a manufacturing method thereof, and an electronic assembly.

BACKGROUND OF THE DISCLOSURE

A chip encapsulated in conventional package structure is soldered onto a circuit board in a flip-chip manner, but a distance between a conductive portion and an electromagnetic interference (EMI) shielding layer in the conventional package structure is usually too short (causing them to be too close to each other), such as to easily result in the conductive portion and the EMI shielding layer having a short circuit there-between due to a soldering material that is used.

SUMMARY OF THE DISCLOSURE

In response to the above-referenced technical inadequacy, the present disclosure provides an EMI shielding package structure, a manufacturing method thereof, and an electronic assembly to effectively improve on the issues associated with conventional package structures.

In one aspect, the present disclosure provides a manufacturing method of an electromagnetic interference (EMI) shielding package structure, which includes a preparing step, a first coating step, a second coating step, and a permeating step. The preparing step is implemented by providing a chip-scale package structure that includes a carrier, at least one chip, and an encapsulant. The carrier has a first board surface, a second board surface being opposite to the first board surface, and a surrounding lateral edge that is connected to the first board surface and the second board surface. The carrier has a plurality of conductive portions arranged on the second board surface. The at least one chip is mounted on the first board surface of the carrier. The encapsulant is formed on the first board surface of the carrier, and the at least one chip is embedded in the encapsulant. The first coating step is implemented by adhering the second board surface of the carrier of the chip-scale package structure onto an ultraviolet (UV) release tape and then coating an EMI shielding layer on an outer surface of the chip-scale package structure. Moreover, a bottom edge of the EMI shielding layer is flush with the second board surface of the carrier. The second coating step is implemented by adhering the second board surface of the carrier and the bottom edge of the EMI shielding layer onto a thermal release tape after separating the chip-scale package structure from the UV release tape, and then coating an insulating layer on an outer surface of the EMI shielding layer. Moreover, a bottom edge of the insulating layer is flush with the bottom edge of the EMI shielding layer. The permeating step is implemented by heating the thermal release tape for a predetermined period of time to enable the insulating layer to form a capillary permeating portion covering the bottom edge of the EMI shielding layer by permeating along the thermal release tape toward the second board surface through capillary action.

In another aspect, the present disclosure provides an electronic assembly, which includes an EMI shielding package structure, a circuit board, and a plurality of soldering bodies. The EMI shielding package structure includes a carrier, at least one chip, an encapsulant, an EMI shielding layer, and an insulating layer. The carrier has a first board surface, a second board surface being opposite to the first board surface, and a surrounding lateral edge that is connected to the first board surface and the second board surface. The carrier has a plurality of conductive portions arranged on the second board surface. The at least one chip is mounted on the first board surface of the carrier and is electrically coupled to at least one of the conductive portions. The encapsulant is formed on the first board surface of the carrier, and the at least one chip is embedded in the encapsulant. The EMI shielding layer is formed on the surrounding lateral edge of the carrier and an outer surface of the encapsulant, and a bottom edge of the EMI shielding layer is flush with the second board surface of the carrier. The insulating layer includes a spraying portion and a capillary permeating portion. The spraying portion is formed on at least part of an outer surface of the EMI shielding layer. The capillary permeating portion is formed by extending from a bottom end of the spraying portion toward the second board surface through capillarity. The capillary permeating portion covers the bottom edge of the EMI shielding layer. The circuit board includes a plurality of connection pads. The conductive portions of the EMI shielding package structure are respectively disposed above the connection pads, and the capillary permeating portion is disposed above the connection pads. The soldering bodies connect the EMI shielding package structure and the circuit board. Each of the conductive portions and a corresponding one of the connection pads are connected to each other through one of the soldering bodies. The EMI shielding layer is separate from any one of the soldering bodies through the capillary permeating portion.

In yet another aspect, the present disclosure provides an EMI shielding package structure, which includes a carrier, at least one chip, an encapsulant, an EMI shielding layer, and an insulating layer. The carrier has a first board surface, a second board surface being opposite to the first board surface, and a surrounding lateral edge that is connected to the first board surface and the second board surface. The at least one chip is mounted on the first board surface of the carrier. The encapsulant is formed on the first board surface of the carrier, and the at least one chip is embedded in the encapsulant. The EMI shielding layer is formed on the surrounding lateral edge of the carrier and an outer surface of the encapsulant, and a bottom edge of the EMI shielding layer is flush with the second board surface of the carrier.

The insulating layer includes a spraying portion and a capillary permeating portion. The spraying portion is formed on at least part of an outer surface of the EMI shielding layer. The capillary permeating portion is formed by extending from a bottom end of the spraying portion toward the second board surface through capillarity. The capillary permeating portion covers the bottom edge of the EMI shielding layer.

Therefore, after the steps of the manufacturing method provided by the present disclosure are sequentially implemented (e.g., the manufacturing method is implemented by using the UV release tape and the thermal release tape each have different properties), the EMI shielding package structure can be manufactured with the ability to effectively avoid short circuit issues.

Moreover, in the EMI shielding package structure or the electronic assembly of the present disclosure, the bottom edge of the EMI shielding layer can be covered through the capillary permeating portion of the insulating layer, thereby preventing the bottom edge of the EMI shielding layer from causing a short circuit with other components (e.g., at least one of the conductive portions).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
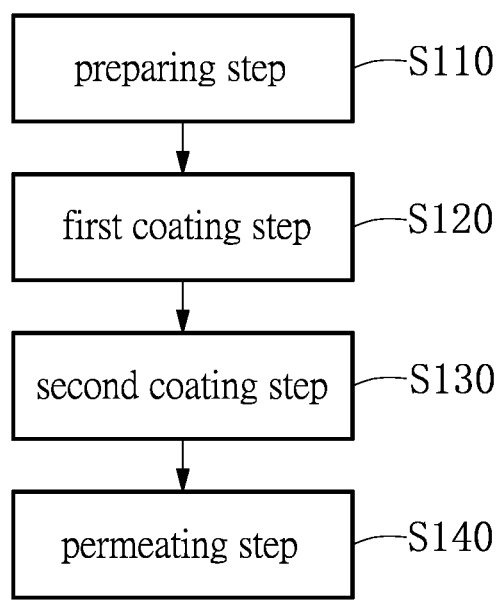
FIG. 1 is a flowchart of a manufacturing method of an EMI shielding package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides a manufacturing method of an electromagnetic interference (EMI) shielding package structure 100. In order to clearly realize the present embodiment, the following description describes the manufacturing method, and then describes the configuration of the EMI shielding package structure 100.

The manufacturing method in the present embodiment sequentially includes a preparing step S110, a first coating step S120, a second coating step S130, and a permeating step S140. The following description sequentially describes the steps S110-S140, but the present disclosure is not limited thereto. For example, in other embodiments of the present disclosure not shown in the drawings, any one of the steps S110-S140 can be adjusted or changed according to design requirements.

Figure 2:
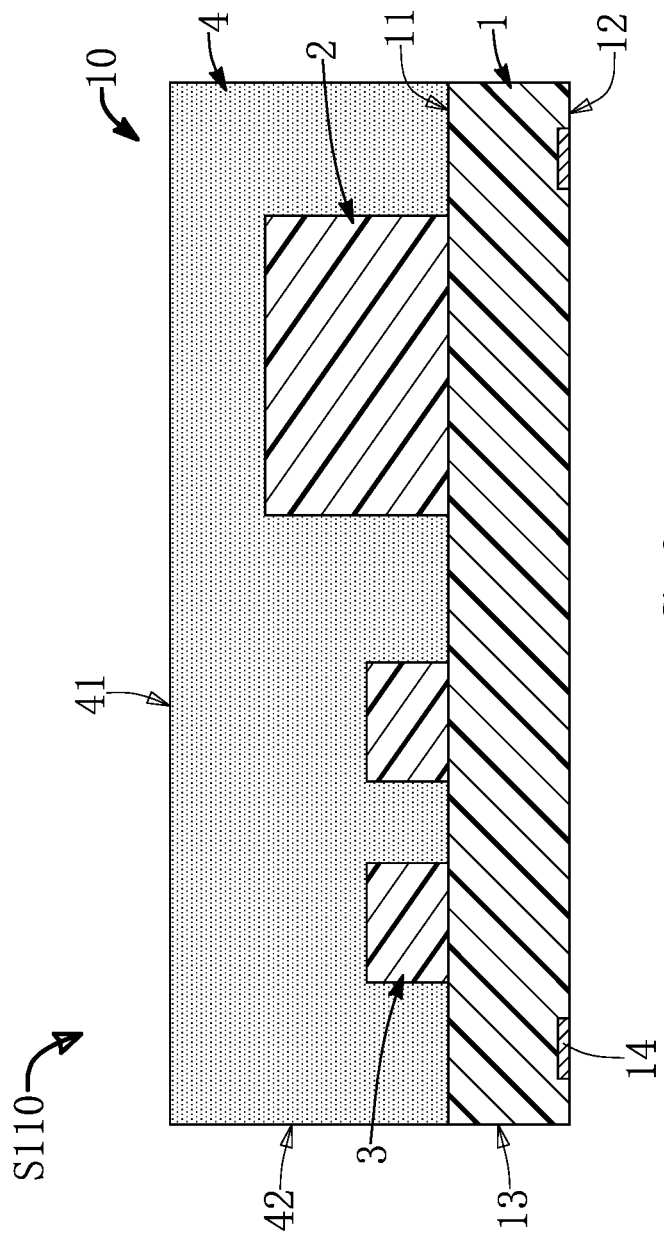
FIG. 2 is a schematic view showing a preparing step of FIG. 1.

As shown in FIG. 1 and FIG. 2, the preparing step S110 is implemented by providing a chip-scale package structure 10. The chip-scale package structure 10 includes a carrier 1, at least one chip 2 mounted on the carrier 1, at least one passive component 3 mounted on the carrier 1, and an encapsulant 4 that is formed on the carrier 1. Specifically, the carrier 1 is a flat board and includes a first board surface 11, a second board surface 12 being parallel and opposite to the first board surface 11, and a surrounding lateral edge 13 that is connected to the first board surface 11 and the second board surface 12.

In more detail, the at least one chip 2 and the at least one passive component 3 are mounted on the first board surface 11 of the carrier 1, the encapsulant 4 is formed on the first board surface 11 of the carrier 1, and the at least one chip 2 and the at least one passive component 3 are embedded in the encapsulant 4. The encapsulant 4 of the present embodiment is a molding compound for being accurately formed into a predetermined shape, but the present disclosure is not limited thereto.

Moreover, type of the at least one chip 2 can be adjusted or changed according to design requirements. For example, the at least one chip 2 can be a radio frequency identification (RFID) chip, a mobile payment chip, a machine-to-machine (M2M) chip, a wireless sensor chip, or a communication chip in other types.

In addition, the carrier 1 includes a plurality of conductive portions 14 arranged on the second board surface 12, and at least one of the conductive portions 14 is electrically coupled to the at least one chip 2. In the present embodiment, the conductive portions 14 are metal pads being suitable for the surface mount technology (SMT), and an outer surface of each of the conductive portions 14 is substantially coplanar with the second board surface 12, but the present disclosure is not limited thereto.

Figure 3:
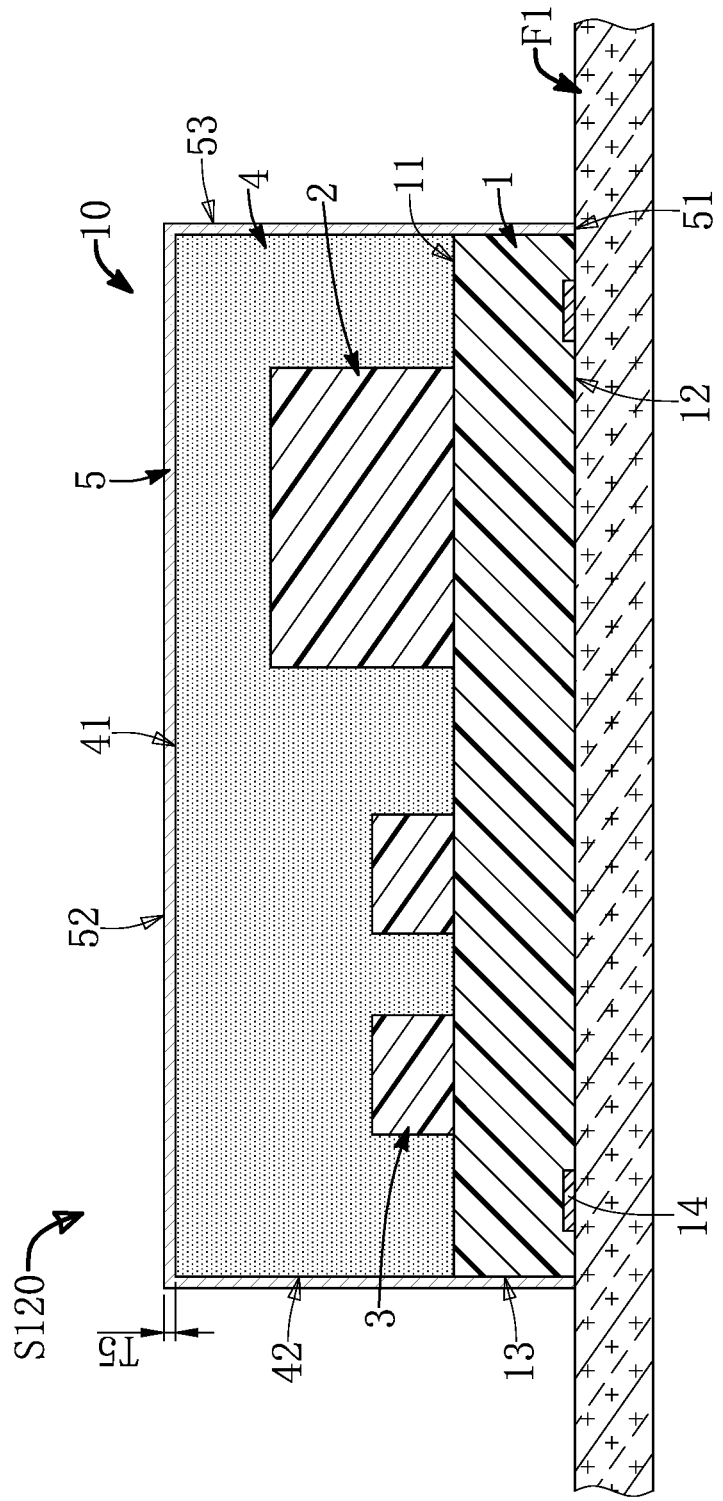
FIG. 3 is a schematic view showing a first coating step of FIG. 1.

As shown in FIG. 1 and FIG. 3, the first coating step S120 is implemented by adhering the second board surface 12 of the carrier 1 of the chip-scale package structure 10 onto an ultraviolet (UV) release tape F1 and then coating an EMI shielding layer 5 on an outer surface of the chip-scale package structure 10. Moreover, a bottom edge 51 of the EMI shielding layer 5 is flush with the second board surface 12 of the carrier 1. In other words, the second board surface 12 of the carrier 1 is gaplessly adhered to the UV release tape F1 so as to prevent the EMI shielding layer 5 from extending to the second board surface 12 of the carrier 1 during a coating process.

It should be noted the conductive portions 14 of the carrier 1 are adhered to the UV release tape F1, the outer surface of the chip-scale package structure 10 includes the surrounding lateral edge 13 of the carrier 1 and a top surface 41 and lateral surfaces 42 of the encapsulant 4, and the lateral surfaces 42 of the encapsulant 4 are flush with or coplanar with the surrounding lateral edge 13 of the carrier 1. In the present embodiment, the EMI shielding layer 5 is preferably a nano-metallic layer having a thickness T5 within a range from 3 lam to 5 μm, and the EMI shielding layer 5 covers and is connected to an entirety of the outer surface of the chip-scale package structure 10, but the present disclosure is not limited thereto.

Figure 4:
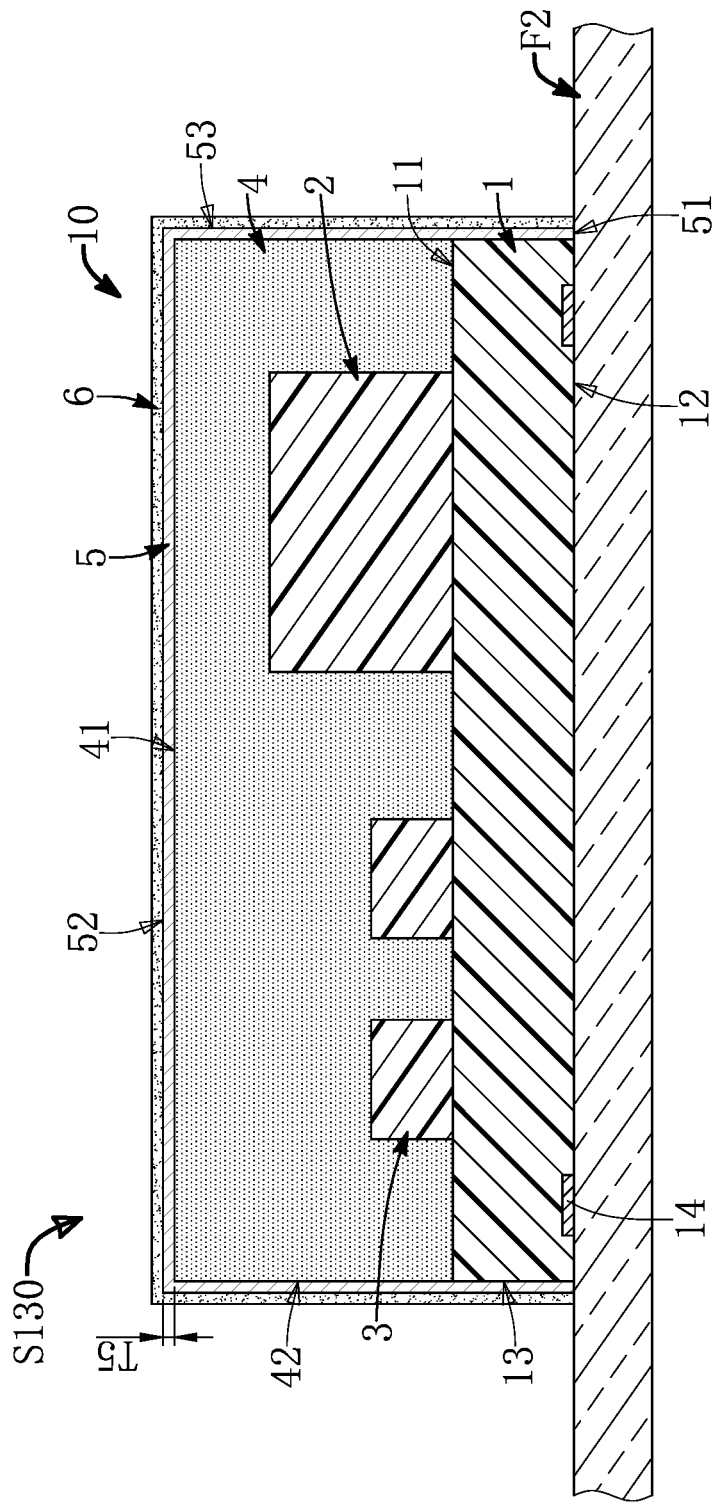
FIG. 4 is a schematic view showing a second coating step of FIG. 1.
Figure 5:
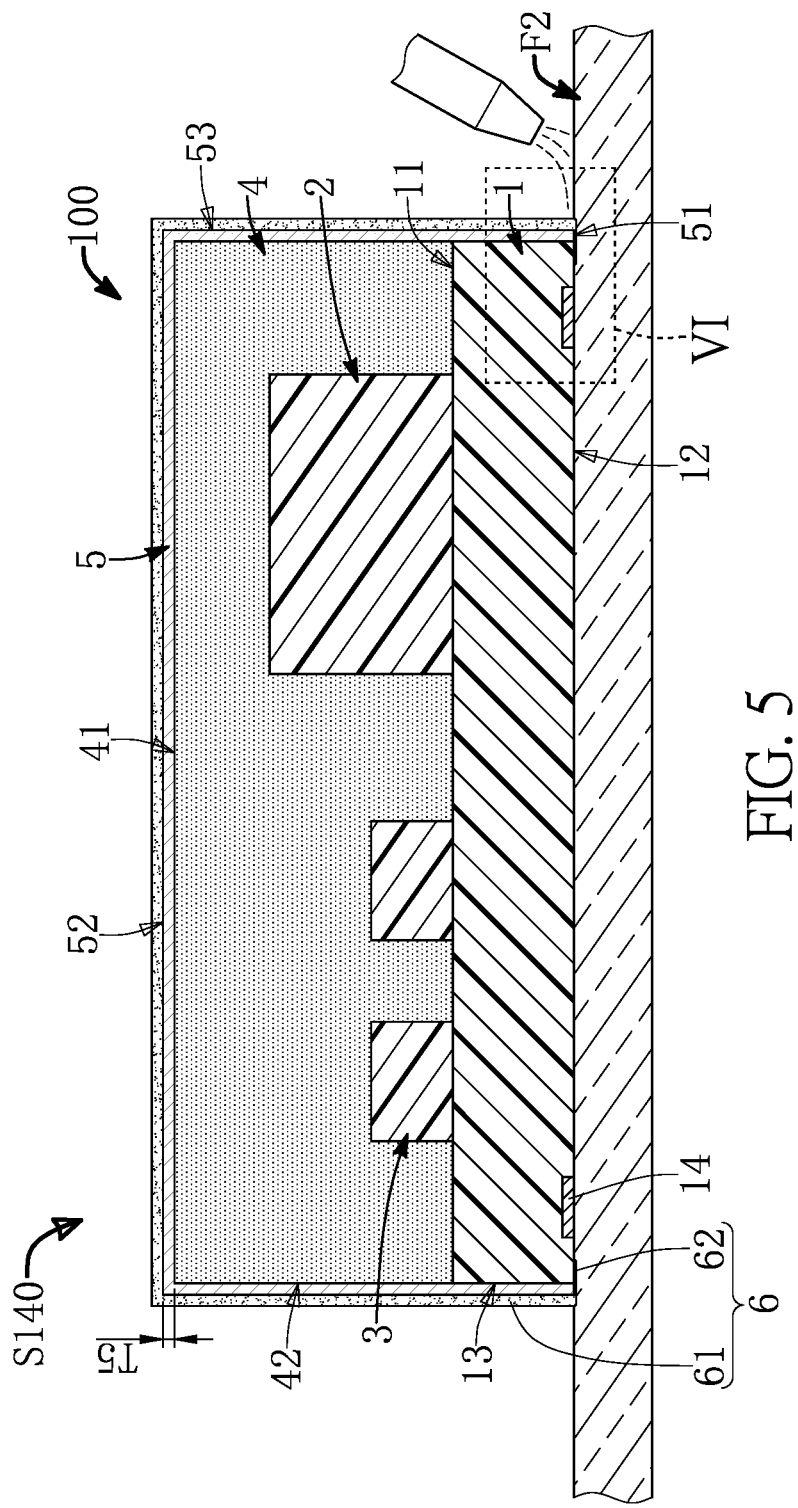
FIG. 5 is a schematic view showing a permeating step of FIG. 1.
Figure 6:
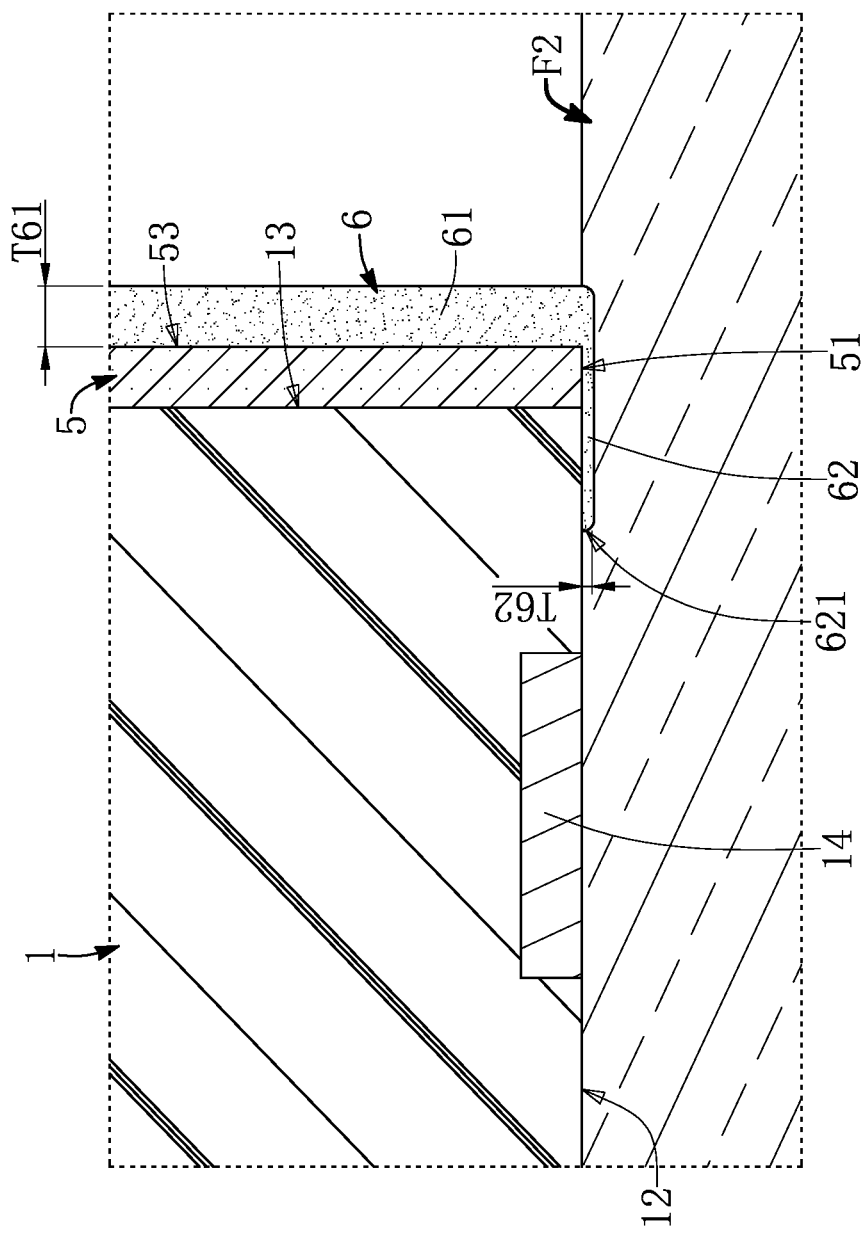
FIG. 6 is an enlarged view showing region VI of FIG. 5.
Figure 7:
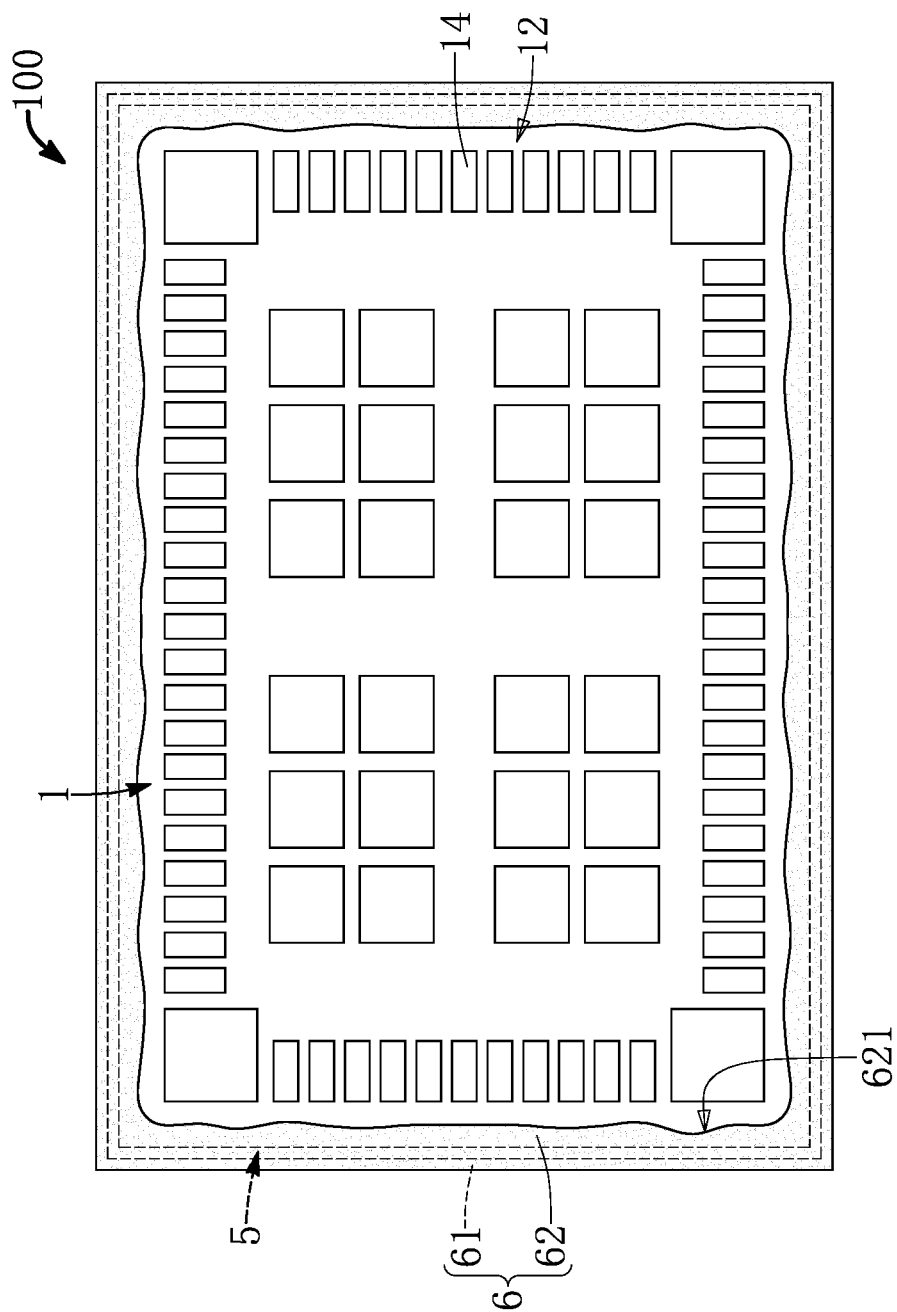
FIG. 7 is a bottom view of the EMI shielding package structure according to the first embodiment of the present disclosure.

As shown in FIG. 1 and FIG. 4, the second coating step S130 is implemented by adhering the second board surface 12 of the carrier 1 and the bottom edge 51 of the EMI shielding layer 5 onto a thermal release tape F2 after separating the chip-scale package structure 10 from the UV release tape F1, and then coating an insulating layer 6 on an outer surface of the EMI shielding layer 5.

It should be noted that the outer surface of the EMI shielding layer 5 includes a top surface 52 and a surrounding lateral surface 53 that is connected to the top surface 52 and the bottom edge 51. In the present embodiment, the insulating layer 6 can include a transparent epoxy resin, and the insulating layer 6 preferably covers and is directly connected to an entirety of the outer surface of the EMI shielding layer 5, but the present disclosure is not limited thereto.

Specifically, in the second coating step S130, a bottom edge of the insulating layer 6 is flush with the bottom edge 51 of the EMI shielding layer 5. In other words, the second board surface 12 of the carrier 1 and the bottom edge 51 of the EMI shielding layer 5 in the second coating step S130 are gaplessly adhered to the thermal release film F2 so as to prevent the insulating layer 6 in a coating process from extending to the bottom edge 51 of the EMI shielding layer 5 and the second board surface 12 of the carrier 1.

As shown in FIG. 1 and FIG. 5 to FIG. 7, the permeating step S140 is implemented by heating the thermal release tape F2 for a predetermined period of time to enable the insulating layer 6 to form a capillary permeating portion 62 covering the bottom edge 52 of the EMI shielding layer 5 by permeating along the thermal release tape F2 toward the second board surface 12 through capillary action.

Specifically, the thermal release tape F2 is heated (e.g., the thermal release tape F2 is heated in an environment of 80° C. to 100° C. for 1 minute to 5 minutes) to slightly reduce a viscosity thereof, so that a part of the insulating layer 6 that has not yet been solidified can permeate along (i.e., through capillary action) the thermal release tape F2 to cover the bottom edge 51 of the EMI shielding layer 5. Moreover, an inner edge 621 of the capillary permeating portion 62 is in an irregular shape, but a position of the inner edge 621 of the capillary permeating portion 62 can be controlled by heating the thermal release tape F2 for the predetermined period of time, so that the inner edge 621 of the capillary permeating portion 62 is arranged inside of the bottom edge 51 of the EMI shielding layer 5 and outside of the conductive portions 14. In other words, the capillary permeating portion 62 has a ring shape, and the inner edge 621 has an irregular loop-shape that is located between the bottom edge 51 of the EMI shielding layer 5 and the conductive portions 14.

In summary, after the steps S110-S140 of the manufacturing method provided by the present embodiment are sequentially implemented (e.g., the manufacturing method is implemented by using the UV release tape F1 and the thermal release tape F2 that each have different properties), the EMI shielding package structure 100 being effectively avoided to have the short circuit issue is manufactured. Specifically, the bottom edge 51 of the EMI shielding layer 5 in the EMI shielding package structure 100 can be covered through the capillary permeating portion 62 of the insulating layer 6, thereby preventing the bottom edge 51 of the EMI shielding layer 5 from causing a short circuit with other components (e.g., at least one of the conductive portions 14).

The following description briefly describes the configuration of the EMI shielding package structure 100, and the detailed features of the EMI shielding package structure 100 can be referred to in the above description, but the EMI shielding package structure 100 is not limited to being manufactured by implementing the manufacturing method of the present embodiment. For example, in other embodiments of the present disclosure not shown in the drawings, the EMI shielding package structure 100 can also be manufactured by implementing varying degrees of adjustments to the steps S110-S140, or implementing other methods.

As shown in FIG. 1 and FIG. 5 to FIG. 7, the EMI shielding package structure 100 in the present embodiment includes a carrier 1, at least one chip 2 mounted on the carrier 1, at least one passive component 3 mounted on the carrier 1, an encapsulant 4 formed on the carrier 1, an EMI shielding layer 5, and an insulating layer 6. It should be noted that any package structure not having an EMI shielding layer is different from the EMI shielding package structure 100 provided by the present embodiment.

The carrier 1 can be a flat circuit board, and the carrier 1 includes a first board surface 11, a second board surface 12 being opposite to the first board surface 11, and a surrounding lateral edge 13 that is connected to the first board surface 11 and the second board surface 12. The carrier 1 includes a plurality of conductive portions 14 arranged on the second board surface 12, and each of the conductive portions 14 is preferably coplanar with the second board surface 12, but the present disclosure is not limited thereto. Moreover, the at least one chip 2 and the at least one passive component 3 are mounted on the first board surface 11 of the carrier 1, so that each of the at least one chip 2 and the at least one passive component 3 is electrically coupled to at least one of the conductive portions 14 of the carrier 1.

The encapsulant 4 is formed on the first board surface 11 of the carrier 1, and the at least one chip 2 and the at least one passive component 3 are embedded in the encapsulant 4. Moreover, an outer surface of the encapsulant 4 includes a top surface 41 and a plurality of lateral surfaces 42. The lateral surfaces 42 of the encapsulant 4 are flush with or coplanar with the surrounding lateral edge 13 of the carrier 1.

Moreover, the EMI shielding layer 5 is formed on the surrounding lateral edge 13 of the carrier 1 and the outer surface of the encapsulant 4. A bottom edge 51 of the EMI shielding layer 5 is flush with (or coplanar with) the second board surface 12 of the carrier 1. Moreover, an outer surface of the EMI shielding layer 5 includes a top surface 52 and a surrounding lateral surface 53 that is connected to the top surface 52 and the bottom edge 51.

The insulating layer 6 includes a spraying portion 61 and a capillary permeating portion 62 that extends from the spraying portion 61. The spraying portion 61 is formed on an entirety of the outer surface of the EMI shielding layer 5. The capillary permeating portion 62 is formed by extending from a bottom end of the spraying portion 51 toward the second board surface 12 through capillarity, and the capillary permeating portion 62 covers and is connected to the bottom edge 51 of the EMI shielding layer 5, thereby effectively preventing the bottom edge 51 of the EMI shielding layer 5 from causing a short circuit with other components (e.g., at least one of the conductive portions 14).

Specifically, an inner edge 621 of the capillary permeating portion 62 in the present embodiment is in an irregular shape, the inner edge 621 of the capillary permeating portion 62 is arranged inside of the bottom edge 51 of the EMI shielding layer 5 and outside of the conductive portions 14, and a thickness T62 of the capillary permeating portion 62 is preferably less than a thickness T61 of the spraying portion 61, but the present disclosure is not limited thereto.

Second Embodiment

Figure 8:
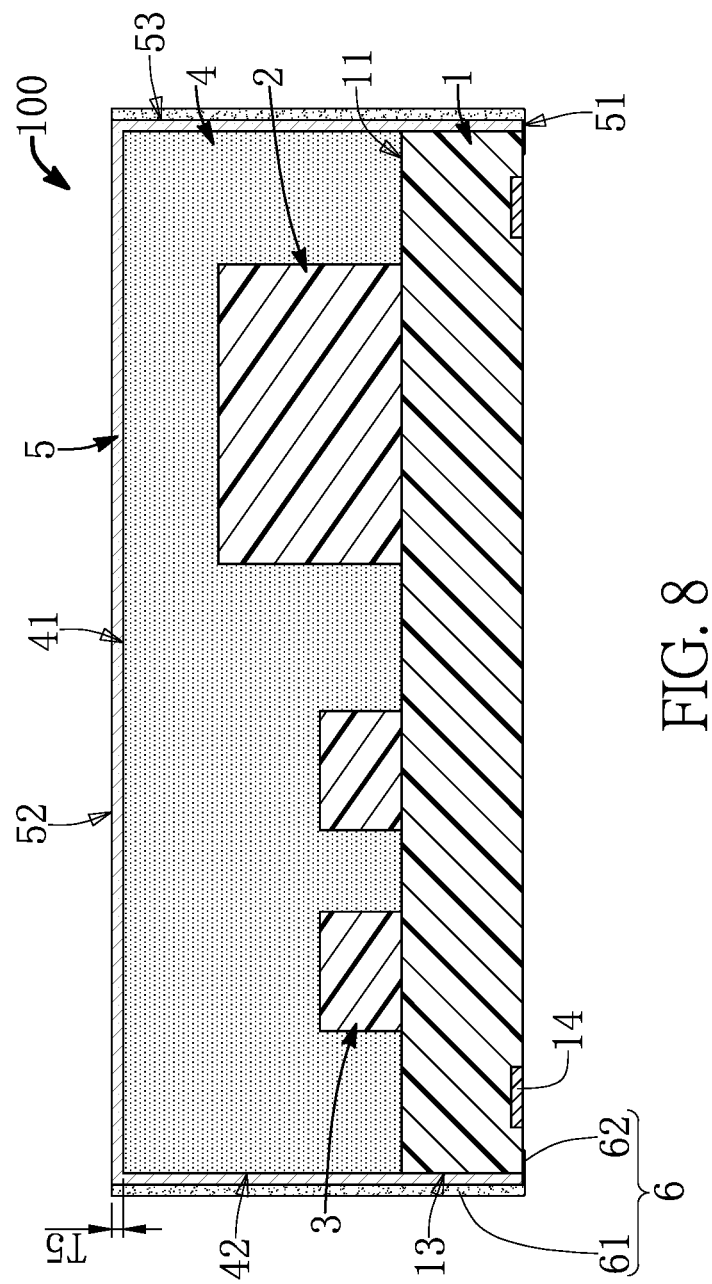
FIG. 8 is a cross-sectional view of the EMI shielding package structure according to a second embodiment of the present disclosure.

Referring to FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the spraying portion 61 of the insulating layer 6 only covers or is formed on the surrounding lateral surface 53 of the EMI shielding layer 5, and the top surface 52 of the EMI shielding layer 5 is exposed from the insulating layer 6. In other words, according to the descriptions of the first and second embodiments, the spraying portion 61 of the insulating layer 6 can be formed on at least part of the outer surface of the EMI shielding layer 5.

Third Embodiment

Figure 9:
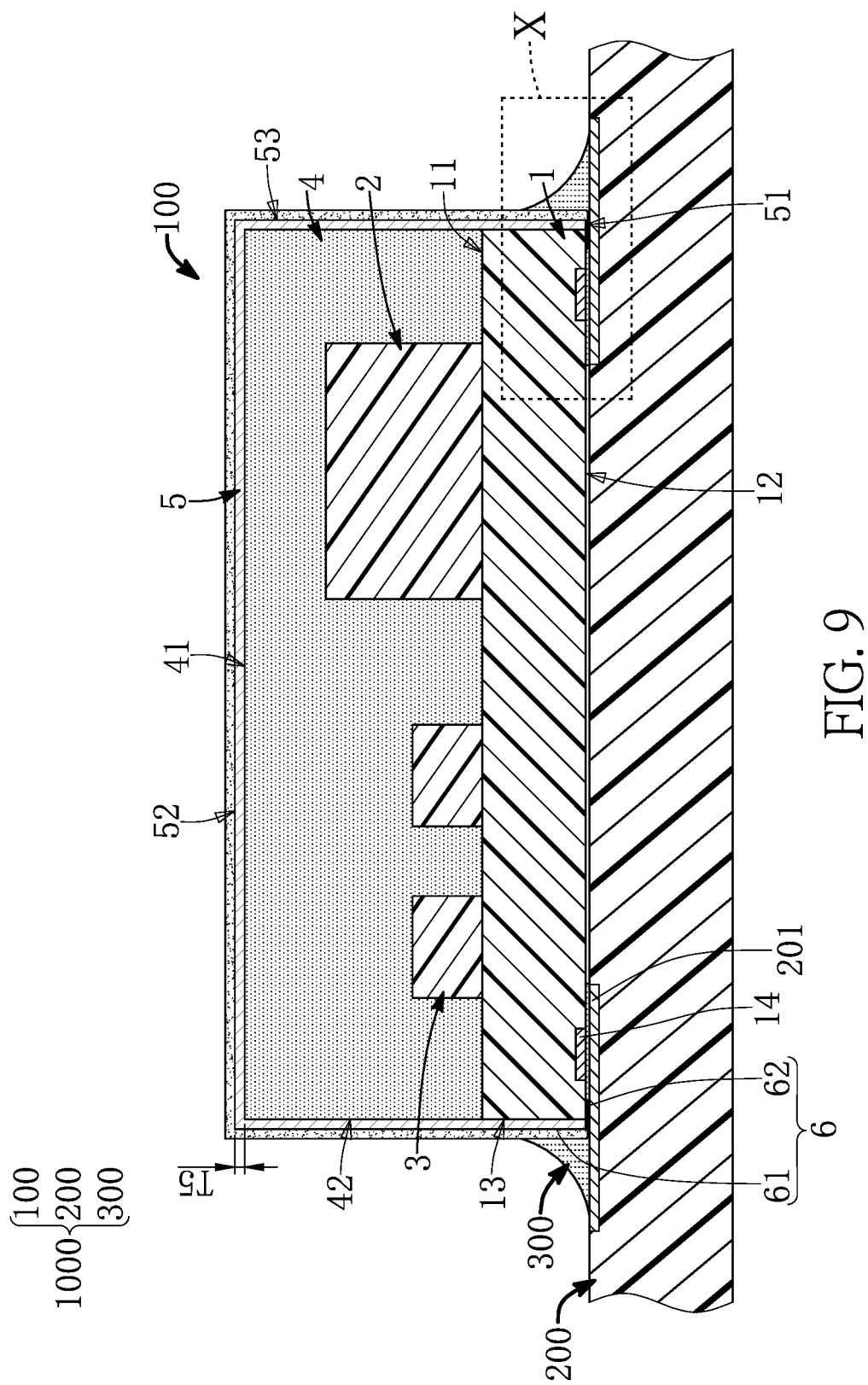
FIG. 9 is a cross-sectional view of the EMI shielding package structure according to a third embodiment of the present disclosure.
Figure 10:
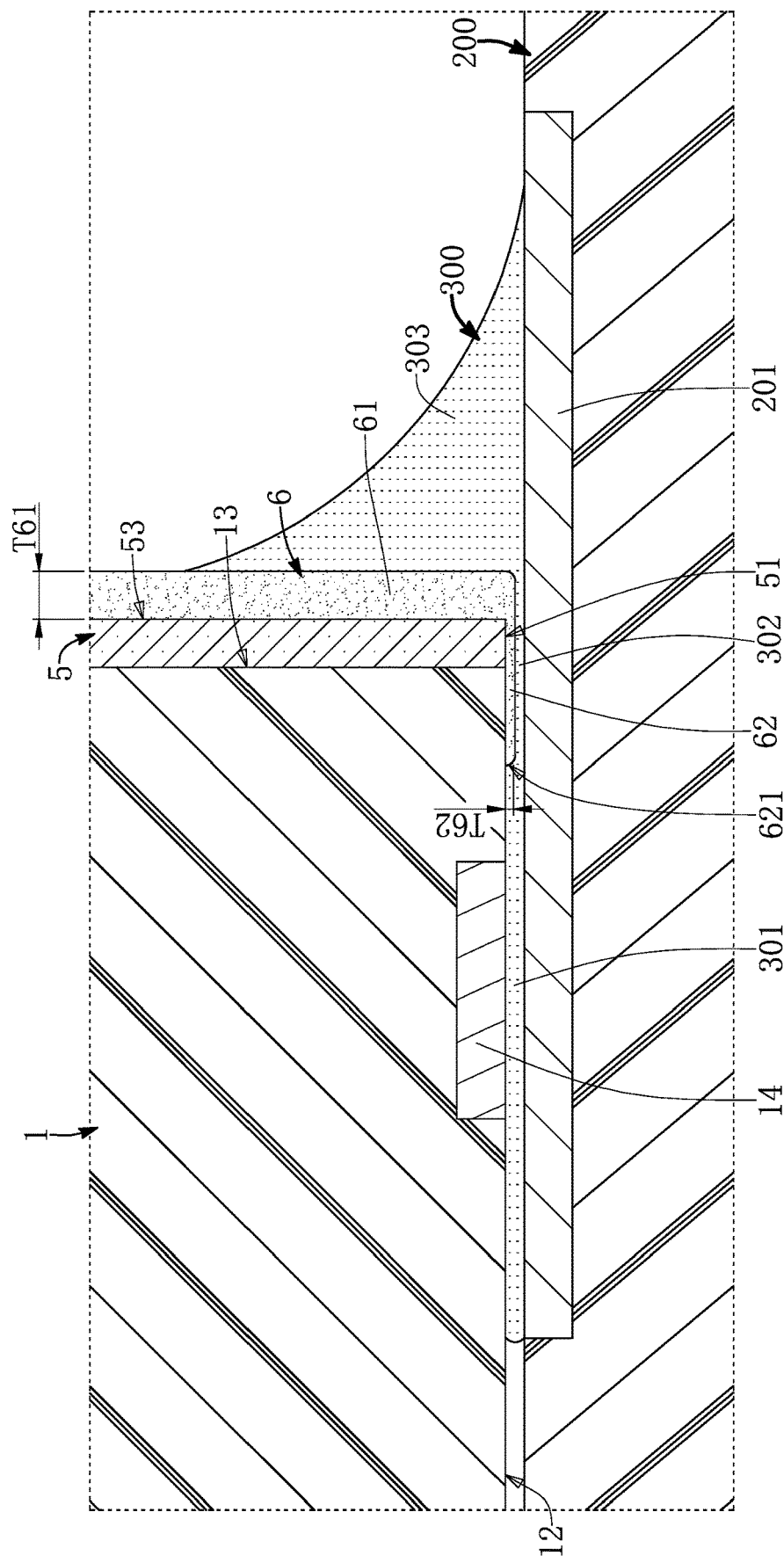
FIG. 10 is an enlarged view showing region X of FIG. 9.

Referring to FIG. 9 and FIG. 10, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

The present embodiment provides an electronic assembly 1000 including an EMI shielding package structure 100, a circuit board 200, and a plurality of soldering bodies 300 that connect the EMI shielding package structure 100 and the circuit board 200. Since the EMI shielding package structure 100 of the present embodiment is identical to that of the first embodiment (or the second embodiment), the following description does not describe the configuration of the EMI shielding package structure 100 for the sake of brevity.

The circuit board 200 includes a plurality of connection pads 201 respectively corresponding in position to the conductive portions 14. The conductive portions 14 of the EMI shielding package structure 100 are respectively disposed above the connection pads 14, and the capillary permeating portion 62 is disposed above the connection pads 201. Moreover, each of the conductive portions 14 and a corresponding one of the connection pads 201 are connected to each other through one of the soldering bodies 300, and the EMI shielding layer 5 is separate from any one of the soldering bodies 300 through the capillary permeating portion 62, thereby effectively preventing the bottom edge 51 of the EMI shielding layer 5 from having a short circuit with any one of the conductive portions 14.

Specifically, each of the conductive portions 14 corresponds in size to the corresponding connection pad 201. For example, a projection region defined by orthogonally projecting each of the conductive portions 14 onto the circuit board 200 is located inside of an outer contour of the corresponding connection pad 201. Accordingly, the connection pads 201 of the circuit board 200 do not need to be adjusted according to the size of the conductive portions 14, so that the circuit board 200 can be provided with a more flexible range of application (e.g., the circuit board 200 can be applied to a wider variety of package structures).

In addition, as the soldering bodies 300 in the present embodiment are of the substantially same structure, the following description discloses the structure of one of the soldering bodies 300 for the sake of brevity, but the present disclosure is not limited thereto. As shown in FIG. 10, the soldering body 300 includes a connection portion 301, an extension portion 302 extending from the connection portion 301, and a climbing portion 303 that extends from the extension portion 302. The connection portion 301 is connected to and arranged between the corresponding conductive portion 14 and the corresponding connection pad 201, the extension portion 302 is connected to and arranged between the corresponding connection pad 201 and the capillary permeating portion 62, and the climbing portion 303 is connected to the corresponding connection pad 201 and a part of the spraying portion 61.

BENEFICIAL EFFECTS OF THE EMBODIMENTS

In conclusion, after the steps of the manufacturing method provided by the present disclosure are sequentially implemented (e.g., the manufacturing method is implemented by using the UV release tape and the thermal release tape each have different properties), the EMI shielding package structure can be manufactured with the ability to effectively avoid short circuit issues.

Moreover, in the EMI shielding package structure or the electronic assembly of the present disclosure, the bottom edge of the EMI shielding layer can be covered through the capillary permeating portion of the insulating layer, thereby preventing the bottom edge of the EMI shielding layer from causing a short circuit with other components (e.g., at least one of the conductive portions).

In addition, the electronic assembly of the present disclosure is provided with the EMI shielding package structure having the capillary permeating portion, so that the connection pads of the circuit board do not need to be adjusted according to the size of the conductive portions, thereby enabling the circuit board to have a more flexible range of application.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of an electromagnetic interference (EMI) shielding package structure, comprising:
    a preparing step implemented by providing a chip-scale package structure including:
        a carrier having a first board surface, a second board surface being opposite to the first board surface, and a surrounding lateral edge that is connected to the first board surface and the second board surface, wherein the carrier has a plurality of conductive portions arranged on the second board surface;
        at least one chip mounted on the first board surface of the carrier; and
        an encapsulant formed on the first board surface of the carrier, wherein the at least one chip is embedded in the encapsulant;
    a first coating step implemented by adhering the second board surface of the carrier of the chip-scale package structure onto an ultraviolet (UV) release tape and then coating an EMI shielding layer on an outer surface of the chip-scale package structure, wherein a bottom edge of the EMI shielding layer is flush with the second board surface of the carrier;
    a second coating step implemented by adhering the second board surface of the carrier and the bottom edge of the EMI shielding layer onto a thermal release tape after separating the chip-scale package structure from the UV release tape, and then coating an insulating layer on an outer surface of the EMI shielding layer, wherein a bottom edge of the insulating layer is flush with the bottom edge of the EMI shielding layer; and
    a permeating step implemented by heating the thermal release tape for a predetermined period of time to enable the insulating layer to form a capillary permeating portion covering the bottom edge of the EMI shielding layer by permeating along the thermal release tape toward the second board surface through capillary action.

2. The manufacturing method according to claim 1, wherein, in the permeating step, an inner edge of the capillary permeating portion is in an irregular shape, and the inner edge of the capillary permeating portion is arranged inside of the bottom edge of the EMI shielding layer and outside of the plurality of conductive portions.

3. The manufacturing method according to claim 1, wherein, in the first coating step, the EMI shielding layer is a nano-metallic layer having a thickness within a range from 3 μm to 5 μm.

4. The manufacturing method according to claim 1, wherein, in the second coating step, the insulating layer includes an epoxy resin.

* * * * *